United States Patent
Le et al.

(10) Patent No.: US 7,041,200 B2
(45) Date of Patent: May 9, 2006

(54) REDUCING PARTICLE GENERATION DURING SPUTTER DEPOSITION

(75) Inventors: Hien-Minh Huu Le, San Jose, CA (US); Keith A. Miller, Sunnyvale, CA (US); Hoa T. Kieu, Sunnyvale, CA (US); Kenny King-Tai Ngan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

(21) Appl. No.: 10/126,333

(22) Filed: Apr. 19, 2002

(65) Prior Publication Data

US 2003/0196890 A1 Oct. 23, 2003

(51) Int. Cl.
*C23C 14/35* (2006.01)

(52) U.S. Cl. .......................... 204/192.12; 204/192.13; 204/192.17; 204/298.11; 204/298.12; 204/298.13; 204/298.19; 204/298.2

(58) Field of Classification Search ........... 204/192.12, 204/192.13, 298.11, 298.12, 298.13, 298.19, 204/298.2, 192.17
See application file for complete search history.

(56) References Cited

U.S. PATENT DOCUMENTS

| | | | | |
|---|---|---|---|---|
| 4,491,496 A | | 1/1985 | Laporte et al. ........ 156/345.47 |
| 4,619,697 A | * | 10/1986 | Hijikata et al. ............... 75/230 |
| 4,717,462 A | | 1/1988 | Homma et al. ........ 204/299.06 |
| 4,938,673 A | | 7/1990 | Adrian ........................ 419/23 |
| 4,995,958 A | * | 2/1991 | Anderson et al. ........ 204/298.2 |
| 5,126,028 A | * | 6/1992 | Hurwitt et al. ........ 204/192.13 |
| 5,133,403 A | | 7/1992 | Yokono et al. ............. 165/185 |
| 5,320,729 A | | 6/1994 | Narizuka et al. |
| 5,409,517 A | | 4/1995 | Satou et al. .................. 75/228 |
| 5,549,802 A | | 8/1996 | Guo ....................... 204/298.11 |
| 5,587,039 A | | 12/1996 | Salimian et al. ........ 156/345.41 |
| 5,695,825 A | | 12/1997 | Scruggs ..................... 427/449 |
| 5,770,136 A | | 6/1998 | Huang |
| 5,800,618 A | | 9/1998 | Niori et al. ............... 118/723 E |
| 5,858,100 A | | 1/1999 | Maeda et al. ............... 118/719 |
| 5,879,523 A | | 3/1999 | Wang et al. ........... 204/298.11 |
| 5,903,428 A | | 5/1999 | Grimard et al. ............ 361/234 |

(Continued)

FOREIGN PATENT DOCUMENTS

EP 0 882 812 A1 12/1998

(Continued)

OTHER PUBLICATIONS

Translation of Japan 08-250427.*

(Continued)

*Primary Examiner*—Rodney G. McDonald
(74) *Attorney, Agent, or Firm*—Ashok K. Janah

(57) ABSTRACT

In a magnetron sputtering chamber, a substrate is placed in the chamber and a deposition shield is maintained about the substrate to shield internal surfaces in the chamber. The deposition shield has a textured surface that may be formed by a hot pressing process or by a coating process, and that allows the accumulated sputtered residues to stick thereto without flaking off. An electrical power is applied to a high density sputtering target facing the substrate to form a plasma in the chamber while a rotating magnetic field of at least about 300 Gauss is applied about the target to sputter the target. Advantageously, the sputtering process cycle can be repeated for at least about 8,000 substrates without cleaning the internal surfaces in the chamber, and even while still generating an average particle count on each processed substrate of less than 1 particle per 10 $cm^2$ of substrate surface area.

28 Claims, 6 Drawing Sheets

U.S. PATENT DOCUMENTS

| | | | |
|---|---|---|---|
| 5,916,378 A | 6/1999 | Bailey et al. | 148/243 |
| 5,953,827 A | 9/1999 | Or et al. | 34/58 |
| 5,976,327 A | 11/1999 | Tanaka et al. | 204/192.15 |
| 6,015,465 A | 1/2000 | Kholodenko et al. | 118/719 |
| 6,022,258 A | 2/2000 | Abbott et al. | 745/49 |
| 6,051,114 A | 4/2000 | Yao et al. | 204/192.3 |
| 6,059,945 A | 5/2000 | Fu et al. | 204/298.12 |
| 6,071,389 A | 6/2000 | Zhang | |
| 6,132,576 A * | 10/2000 | Pearson | 204/298.2 |
| 6,183,614 B1 | 2/2001 | Fu | 204/298.2 |
| 6,227,435 B1 | 5/2001 | Lazarz et al. | 228/125 |
| 6,258,217 B1 | 7/2001 | Richards et al. | |
| 6,274,008 B1 | 8/2001 | Gopalraja et al. | 204/192.17 |
| 6,328,927 B1 * | 12/2001 | Lo et al. | 419/45 |
| 6,582,535 B1 * | 6/2003 | Suzuki et al. | 148/513 |
| 2001/0037938 A1 | 11/2001 | Sato et al. | |

FOREIGN PATENT DOCUMENTS

| | | |
|---|---|---|
| EP | 1 067 577 A2 | 7/2000 |
| EP | 1 049 133 A2 | 11/2000 |
| EP | 1067208 A1 | 1/2001 |
| JP | 54162969 | 12/1979 |
| JP | 04154964 A | 10/1990 |
| JP | 03107453 A | 5/1991 |
| JP | 03-215664 * | 9/1991 |
| JP | 05132772 A | 11/1991 |
| JP | 05-247634 * | 9/1993 |
| JP | 08049069 A | 2/1996 |
| JP | 08-250427 * | 9/1996 |
| JP | 09-272965 * | 10/1997 |
| JP | 2001064769 A | 3/2001 |
| WO | 9917336 | 4/1999 |
| WO | WO-0123635 A1 | 4/2001 |
| WO | WO-0220865 A1 | 3/2002 |

OTHER PUBLICATIONS

PCT International Search Report dated Dec. 17, 2003, European Patent Office, P.B. 5818 Patentlaan 2, NL-2280 HV Rijswijk.

KLA Tencor, *Surfscan SPIDLS*, http://www.klatencor.com/products/defect_control/surfscan-sp1/surfscan.html, accessed Feb. 19, 2002.

* cited by examiner

REDUCING PARTICLE GENERATION DURING SPUTTER DEPOSITION

BACKGROUND

Embodiments of the present invention relate to sputtering material on a substrate in a sputtering chamber.

A sputtering chamber is used to sputter material onto a substrate to manufacture electronic circuits, such as for example, integrated circuits and displays. Typically, the chamber comprises an enclosure wall that encloses a process zone into which a gas is introduced, a gas energizer to energize the gas at least initially during the sputtering process, and an exhaust conduit from which the gases and other species are exhausted and which has a throttle valve to control the pressure in the chamber. The chamber is used to sputter deposit a material from a sputtering target onto the substrate, such as a metal, for example, aluminum, copper, titanium, tantalum or tungsten; or a metal compound, such as for example, tantalum nitride, tungsten nitride or titanium nitride.

In conventional sputtering processes, the yields from the substrate are reduced when particles flake off from the chamber walls and deposit on the substrate during the sputtering process. This arises when sputtered material accumulate on the exposed surfaces of walls and components about the substrate. After a number of sputtering cycles, the accumulated sputtered material becomes thick and it flakes off and deposits as flaked particles on the substrate. The deposited flaked particles cause additional sputtered material deposited on the substrate to deposit conformally over the flakes forming irregularities that short the circuitry being fabricated on the substrate.

In conventional processes, periodically, the sputtering residues are cleaned off from the surfaces inside the chamber, such as for example, the surfaces of the deposition shields and walls surrounding the substrate, to reduce their accumulated thickness and reduce the number of particles flaking off the walls. The chamber may be cleaned by a wet-cleaning process in which the chamber is shut down and an operator scrubs the chamber walls with an acid or solvent. However, the wet cleaning process often varies in quality and thoroughness from session to session perhaps because it is manually performed. The chamber may also be cleaned by a dry-cleaning process in which plasma or microwave-activated cleaning gas is provided in the chamber. However, the cleaning gas is sometimes slow at cleaning-off some types of deposits, for example, those which are relatively thick or which have a chemical composition that is hard to clean. More importantly, the chamber downtime that occurs during the wet or dry cleaning process reduces processing throughput and increases substrate costs, which in the semiconductor and display fabrication industries are highly undesirable. Thus, it is desirable to reduce chamber downtime by processing a larger number of substrates in the chamber without cleaning the chamber.

Thus, it is desirable to have a method of sputter depositing material on a substrate that is capable of reducing the number of flaked-off particles deposited on the substrate even after a large number of process cycles are performed in the chamber. It is further desirable to be able to use the chamber to process a large number of substrates with good yields and without requiring frequent chamber downtime for cleaning.

SUMMARY

A method of processing a substrate in a magnetron sputtering chamber, the method comprising:
(a) placing a substrate in the chamber;
(b) providing a deposition shield having a textured surface about the substrate;
(c) providing an isostatically pressed and sintered sputtering target facing the substrate; and
(d) applying an electrical power to the target to form a plasma in the chamber while applying a magnetic field adjacent to the target, whereby the target is sputtered to deposit sputtered material on the substrate.

A method of processing a batch of substrates in a magnetron sputtering chamber, the method consisting essentially of:
(a) in a sputtering process cycle,
  (i) placing a substrate in the chamber;
  (ii) providing a deposition shield having a textured surface about the substrate,
  (iii) providing a sputtering target facing the substrate, the target having a density substantially greater than 99.99% of the theoretical maximum density of the target material, and
  (iv) applying an electrical power to the target to form a plasma to sputter the target while applying a magnetic field of at least about 300 Gauss adjacent to the target; and
(b) repeating the sputtering process cycle to process a batch of at least about 8,000 substrates without performing a cleaning process to clean internal surfaces in the chamber between the substrate processing steps.

A method of processing a batch of substrates in a magnetron sputtering chamber, the method consisting essentially of:
(a) in a sputtering process cycle,
  (i) placing a substrate in the chamber;
  (ii) providing a deposition shield having a textured surface about the substrate, the textured surface comprising a surface roughness average Ra of from about 700 to about 1400 microinches,
  (iii) providing a sputtering target facing the substrate, the target (1) being isostatically pressed and sintered, (2) having a density substantially greater than 99.99% of the theoretical maximum density of the target material, and (3) having a porosity of less than about 4 voids/cm$^2$, and
  (iv) applying an electrical power to the target to form a plasma to sputter the target while applying a rotating magnetic field of at least about 300 Gauss adjacent to the target at a speed of from about 80 to about 100 rpm; and
(b) repeating the sputtering process cycle to process a batch of at least about 8,000 substrates without performing a cleaning process to clean internal surfaces in the chamber between the substrate processing steps and wherein the average particle count of the batch of processed substrates is less than about 1 particle per 10 cm$^2$ of substrate surface area.

A magnetron sputtering chamber comprising:
(a) a substrate support;
(b) a deposition shield having a textured surface about the substrate;
(c) a gas supply system to provide a gas in the chamber;
(d) an isostatically pressed and sintered target facing the substrate support;

(e) a power source to apply an electrical power to the target to form a plasma in the chamber; and (f) a magnetic field generator capable of applying a magnetic field of at least about 300 Gauss adjacent to the target, whereby the target may be sputtered by the plasma to deposit sputtered material on a substrate on the substrate support.

A magnetron sputtering chamber comprising:

(a) a substrate support;

(b) a deposition shield having a textured surface about the substrate;

(c) a gas supply system to provide a gas in the chamber;

(d) a sputtering target facing the substrate support, the target having a density substantially greater than 99.99% of the maximum theoretical density of the target material;

(e) a power source to apply an electrical power to the target to form a plasma in the chamber;

(f) a magnetic field generator capable of applying a rotating magnetic field of at least about 300 Gauss adjacent to the target; and (g) a controller adapted to control a substrate transport capable of transporting substrates into the chamber, the power source, the gas supply system, and the magnetic field generator, to deposit sputtered material on each substrate of a batch of at least about 8,000 substrates without performing a cleaning process to clean internal surfaces in the chamber between the substrate processing steps, and wherein the average particle count of the batch of processed substrates is less than about 1 particle per 10 $cm^2$ of substrate surface area.

A magnetron sputtering chamber comprising:

(a) a substrate support;

(b) a deposition shield having a textured surface about the substrate, the textured surface comprising a surface roughness average Ra of from about 700 to about 1400 microinches;

(c) a gas supply system to provide a gas in the chamber;

(d) a sputtering target facing the substrate support, the target (i) comprising an isostatically pressed and sintered material, (ii) having a density substantially greater than 99.99% of the maximum theoretical density of the target material, and having a porosity of less than about 4 voids/$cm^2$;

(e) a power source to apply an electrical power to the target to form a plasma in the chamber;

(f) a magnetic field generator capable of applying a rotating magnetic field of at least about 300 Gauss adjacent to the target, the magnetic field being rotated at a speed of from about 80 to about 100 rpm; and (g) a controller adapted to control a substrate transport capable of transporting substrates into the chamber, the power source, the gas supply system, and the magnetic field generator, to deposit sputtered material, sequentially, on a batch of at least about 8,000 substrates without performing a chamber cleaning process between the substrate processing steps and such that the average particle count measured for the batch of processed substrates is less than about 1 particle per 10 $cm^2$ of substrate surface area.

A deposition shield capable of shielding an interior surface in a magnetron sputter deposition chamber from sputtered material generated in the chamber, the deposition shield comprising:

a structure adapted to at least partially cover the interior surface in the chamber, the structure comprising a textured surface of pressed ceramic grains that are shaped and sized to cause the sputtered material to adhere thereto A method of fabricating a deposition shield that is capable of shielding an interior surface in a magnetron sputter deposition chamber from sputtered material generated in the chamber, the method comprising:

(a) forming a mixture of ceramic grains and a binder;

(b) filling a mold with the mixture; and (c) maintaining the mixture in the mold at a temperature and pressure suitable to form a structure of pressed ceramic grains having a textured surface that adheres the sputtered material thereto.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

FIG. 1b is schematic sectional side view of a number of different deposition shields arranged in the sputtering chamber of FIG. 1a;

FIG. 1c is schematic partial sectional side view of a deposition ring, cover ring and an annular chamber shield, all of which surround a substrate resting on a substrate support in the sputtering chamber of FIG. 1a;

FIG. 5 is a schematic sectional view of a design of a permanent magnet suitable for the chamber of FIG. 1a;

FIG. 7 is a simplified block diagram of a hierarchical control structure of an embodiment of a computer program capable of operating the sputtering chamber of FIG. 1a.

DESCRIPTION

Figure 1A:
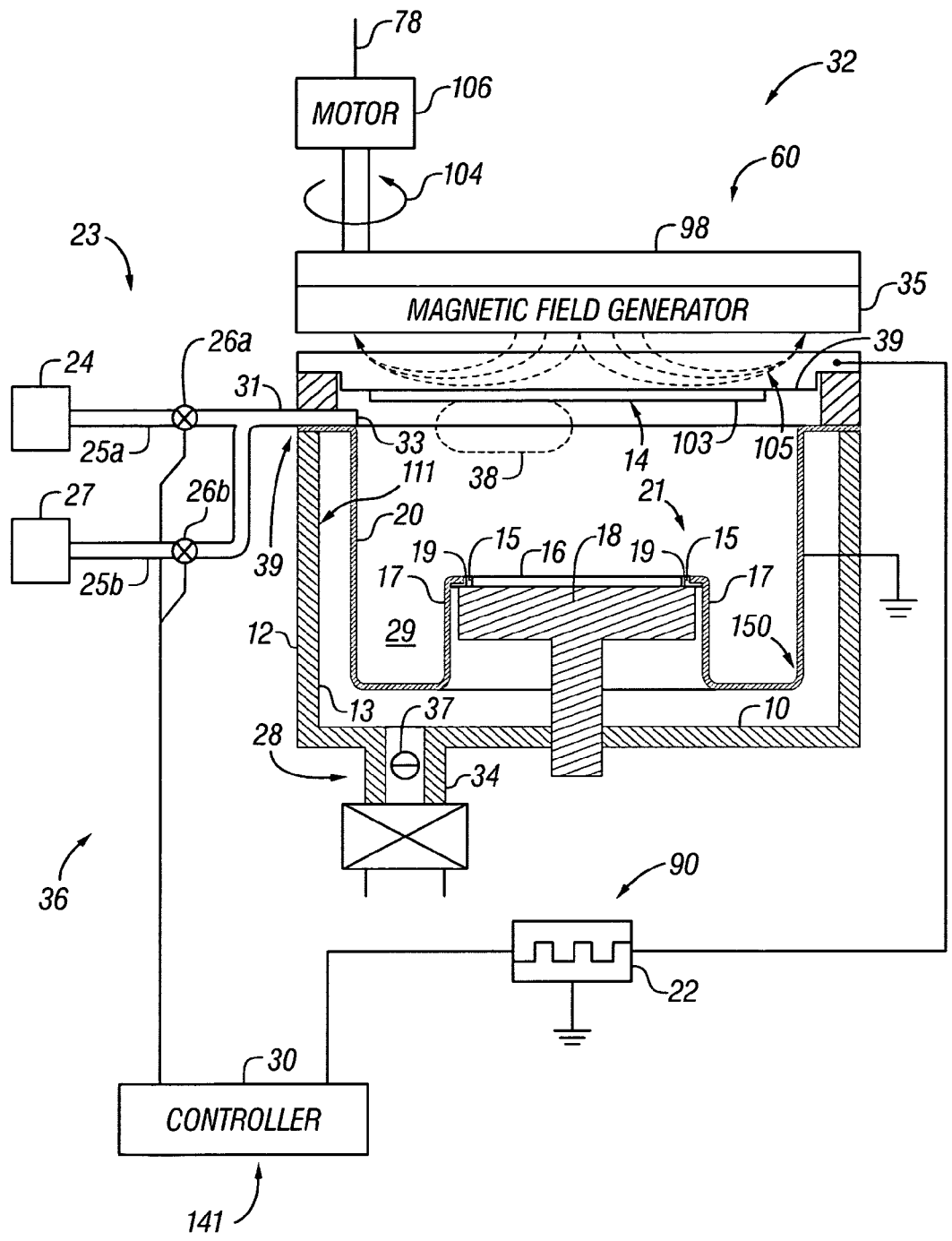
FIG. 1a is a schematic sectional side view of an embodiment of a sputtering chamber suitable for sputter processing a substrate.

A substrate 16 is processed according to the present invention in a magnetron sputtering chamber 36 as illustrated in FIG. 1a. The chamber may be part of a multi-chamber platform (not shown) with interconnected plumbing and electrical systems and having a substrate transport (not shown) to transfer substrates between chambers. This magnetron sputtering chamber 36 is capable of sputter depositing material, such as for example, aluminum, copper, titanium, tantalum, tantalum nitride, tungsten, tungsten nitride and other such sputtered materials, onto the substrate 16. The chamber 36 comprises an enclosure wall 12 that may serve as a sidewall 13, bottom wall 10, or ceiling 39 of the chamber 36. A substrate support 18 supports substrate 16 in the chamber 36. The substrate 16 is introduced into the chamber 36 through a substrate loading inlet (not shown) in the sidewall 13 of the chamber 36 and placed on the support 18. The support 18 can be lifted or lowered by support lift bellows (not shown) and a lift finger assembly (also not shown) can be used to lift and lower the substrate 16 onto the support 18 during transport of the substrate 16 in and out of the chamber 36. While the invention is illustrated in the context of an exemplary chamber, it should be understood that other types of chambers as apparent to one of ordinary skill in the art may also be used, and the invention should not be limited to the illustrated chamber embodiment.

A gas supply 23 may be used to introduce a gas into the chamber 36 to initiate or sustain a plasma in the process zone. The gas is introduced through a gas inlet 33 connected via the gas input lines 25a,b to one or more gas sources 24, 27, respectively. Mass flow controllers 26a,b are used to control the flow rate of the individual gases—which may be premixed in a mixing manifold 31 prior to their introduction into the chamber 36 or which may be separately introduced into the chamber 36. The gas typically includes a non-reactive gas, such as argon or xenon, that when energized into a plasma, energetically impinges upon and bombards the target 14 to sputter material, such as copper, aluminum, titanium, tungsten or tantalum off from the target 14. The gas may also comprise a reactive gas, such as nitrogen. Also, compositions of gas that include other reactive or non-reactive gases, may also be used as would be apparent to one of ordinary skill in the art. Once a plasma is initiated, the gas flow rate may also be gradually tapered off allowing the plasma to be self-initiating and increasingly composed of the ionized sputtered species.

An exhaust system 28 may be used to control the pressure of any gas introduced into the chamber 36 and to exhaust gases, byproducts, and other species from the chamber 36. The exhaust system 28 comprises an exhaust port 29 in the chamber 36 that is connected to an exhaust line 34 that leads to one or more exhaust pumps 29. A throttle valve 37 in the exhaust line 34 may be used to control the pressure of the gas in the chamber 36. The pressure of the gas or sputtered species in the chamber 36 may be set to sub-atmospheric levels, for example, from about 2 to about 10 mTorr, or even lower pressures under 2 mTorr.

A sputtering target 14 comprising target material to be sputtered onto the substrate is placed in the chamber 36 in a facing relationship to the substrate 16. A collimator (not shown) may also be mounted between the target 14 and the substrate support 18. The target 14 is capable of receiving electrical power to generate a plasma in the chamber. For example, the target 14 may be electrically isolated from the chamber 36 and connected to a power source 22 that applies an electrical power to the target. The power source 22 may be a DC or RF power source. In one version, the power source 22, target 14, and gas shield 150 operate as a gas energizer 90 that is capable of forming a plasma in the chamber to sputter material from the plasma. The plasma may be initiated with a gas, such as inert gas, for example, argon, which may be continuously introduced into the chamber during the entire process, or gradually reduced in flow during the process to allow the plasma to be self-sustainable and no longer dependent on the ionized gas species but upon the ionized sputtered species themselves.

In one version, a DC power source 22 applies a DC electrical power to the target 14. The material sputtered from the target 14 by the plasma is deposited on the substrate 16 and may also react with gas components of the plasma to form a sputter deposition layer on the substrate 16. The target 14 may be composed of, for example, aluminum, copper, titanium, tantalum or tungsten.

In the process, use of a dense isostatically pressed and sintered target 14, has been discovered to reduce the number of particles generated on the substrate over conventional targets. For example, conventional chemical vapor deposition (CVD) targets which are made by depositing successive conformal CVD layers onto a backing plate typically have densities of less than 99.99%. In contrast, an isostatically pressed target has a density of at least about 99.999% of the theoretical maximum density of the target material. The isostatically pressed target also has reduced porosity levels, typically, of less than about 4 voids/cm$^2$ or even less than 2 voids/cm$^2$. The target may also be substantially absent pores altogether as determined by visual inspection. It is believed that the density and porosity of the target 14 affects the generation of particles on the substrate 16 because, as the material is sputtered from the target 14, the sputtering material 103 around the voids 101 is less tightly bound to the target 14 and may be more easily knocked loose from the target 14 in chunks that deposit as particles on the substrate 16. Thus, by forming a denser and low pore count target 14, sputtering of the target 14 by the energized gas results in a more uniform and even removal of sputtering material 103 from the target 14 and deposition on the substrate 14 to reduce the number of particles formed on the substrate 14.

Figure 4:
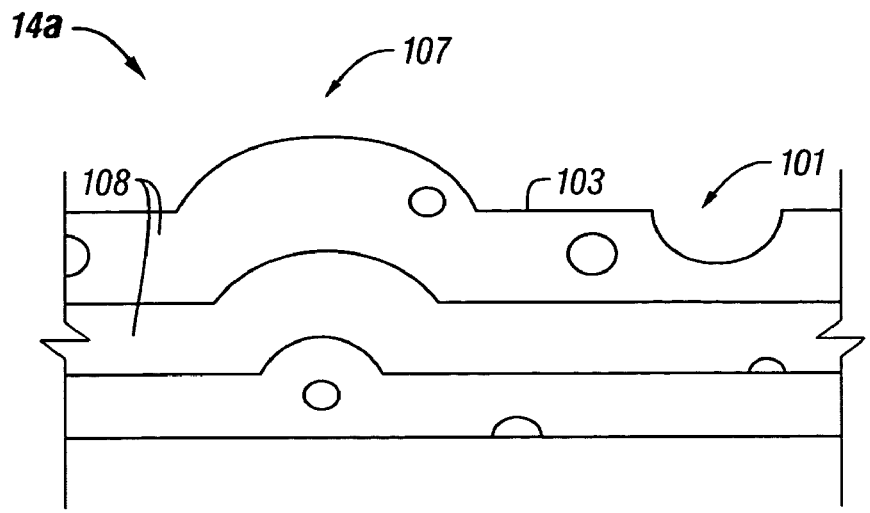
FIG. 4 is a schematic sectional side view of a sputtering target having voids and nodes.

The isostatically pressed and sintered target 14 also comprises fewer surface nodes 107 in comparison to conventional targets 14a, such as the aforementioned CVD targets. CVD targets 14a often have uneven and non-uniformly deposited layers of CVD material 103 that conformally deposit over impurities to form nodes 107 in the target, as for example, shown in FIG. 4. The sizes of the nodes 107 within the unevenly deposited layers increase with additionally deposited CVD layers 108 on the target 14a. These nodes 104 are undesirable, as they may obstruct the uniform sputtering of the target 14 by the energized gas, and the nodes 107 may even de-laminate from the target 14 and form particles on the substrate 16. In contrast, a isostatically pressed target 14 comprises fewer nodes 107 due to the increased uniformity of the sputtering material 103 and provides better sputtering uniformity.

The isostatically pressed target is formed by applying a uniform isostatic pressure to granules of sputtering material 103 in a mold. The uniform pressure reduces the formation of nodes 107 in the pressed sputtering material 103 especially when a vacuum is applied to remove residual trapped air and other species in the mold. In a typical hot isostatic pressing process, a pressurized heated fluid is used to apply pressure on sputtering material placed in an isostatic molding bag that is put in a fluid in a hot isostatic press. A powdered precursor is prepared comprising the sputtering material 103, such as one or more of aluminum, copper, titanium, tantalum or tungsten, which is mixed with an organic binder. The precursor is placed in an isostatic molding bag that is made from a flexible material, such as epoxy rubber, that is capable of withstanding elevated temperatures. The bag is inserted in a pressure chamber in the isostatic press. Heated fluid in the pressure chamber is pressurized to apply an uniform isostatic from all sides around the bag and the precursor inside. A vacuum pump may be connected to the isostatic bag to remove air and any volatilized binder trapped in the isostatic molding bag, thereby increasing the cohesion of the powdered precursor. Once a desired shape and density of the precursor is obtained, the shaped precursor is removed from the molding bag and is sintered to form the sputtering material 103. It has been found that such a pressed target provides much better yields and reduced particulate formation on the substrate 16.

The chamber 36 further comprises a magnetron 32 comprising a magnetic field generator 35 that generates a magnetic field 105 adjacent to the target 14 of the chamber 36. It is believed that this increases an ion density in a high-density plasma region 38 near the target 14. A magnetron 32 that is suitable to allow sustained self-sputtering of copper or sputtering of aluminum, titanium, or other metals while minimizing the need for non-reactive gases for target bombardment purposes is described, for example, in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety. The magnetic field 105 extends through the substantially non-magnetic target 14 into the chamber 36. In one version, the magnetron 32 generates a semi-toroidal magnetic field at the target 14. In one embodiment, the magnetron 32 extends horizontally from approximately a central point on the target 14 to the edge of a usable area of the target 14. In one version, the magnetron 32 comprises a motor 106 to rotate the magnetron 32 about a rotation axis 78. The motor 106 is typically attached to a magnetic yoke 98 of the magnetron 32 by a shaft 104 that extends along the rotation axis 78.

Figure 5:
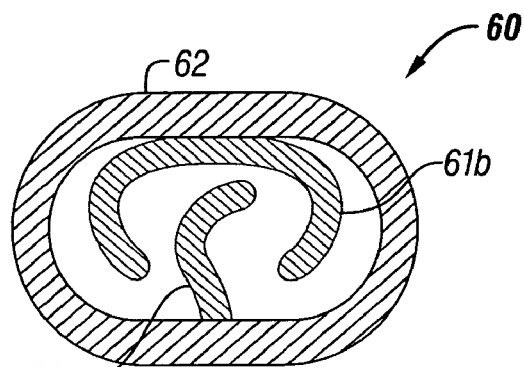

In one version, the magnetic field generator 35 comprises one or more permanent magnets 60 adapted to increase the strength of the magnetic field 105 to reduce particle generation. For example, the permanent magnets 60 may comprise concentric magnet semicircles 61*a,b* formed from permanently magnetized material, as shown in for example FIG. 5. In one version, the magnetic semicircles 61*a,b* may be attached to an outer ring 62 which configures the semicircles 61*a,b* with respect to each other. For example, the magnetic semicircles 61*a,b* may be configured such that a first semicircle 61*a* is inserted into the gap formed by a second semicircle 61*b*. The permanent magnets 60 comprising the concentric magnetic semicircles 61*a,b* may be placed in proximity to the target 14, for example above the target 14 or on a ceiling 39 or sidewall 13 of the chamber 36, to provide the desired increased magnetic field strength in the region about the target 14. In one version, the magnetic field generator 35 may even provide a rotating magnetic field about the sputtering target 14, for example by rotating one or more of the permanent magnets 60, to provide improved ion density and mixing in the energized gas about the target 14. For example, the magnetic field may be rotated at a speed of from about 80 to about 100 rpm in the vicinity of the target 14.

It has been further discovered that the generation of particles on the substrate 16 may be further reduced by providing a magnetic field generator 35 that provides an optimal magnetic field strength in the chamber 36. The optimal magnetic field strength is believed to reduce particle generation on the substrate 16 by reducing the amount of sputtered material that is redeposited onto the target 14. Sputtered material that redeposits on the target 14 tends to flake off the target 14 in large clumps that may deposit on the substrate 16 and form undesirable particles on the substrate 16. Thus, the magnetic field generator 35 may be adapted to provide a magnetic field 105 having a strength in a region about the target 14 that reduces the redeposition of sputtered material onto the target 14. In one version, a suitable optimal magnetic field strength to reduce particle generation may be, for example, at least about 300 Gauss, for example from about 350 to about 600 Gauss. The magnetic field strength is measured in the z direction extending vertically from the plane of the substrate.

Figure 1B:
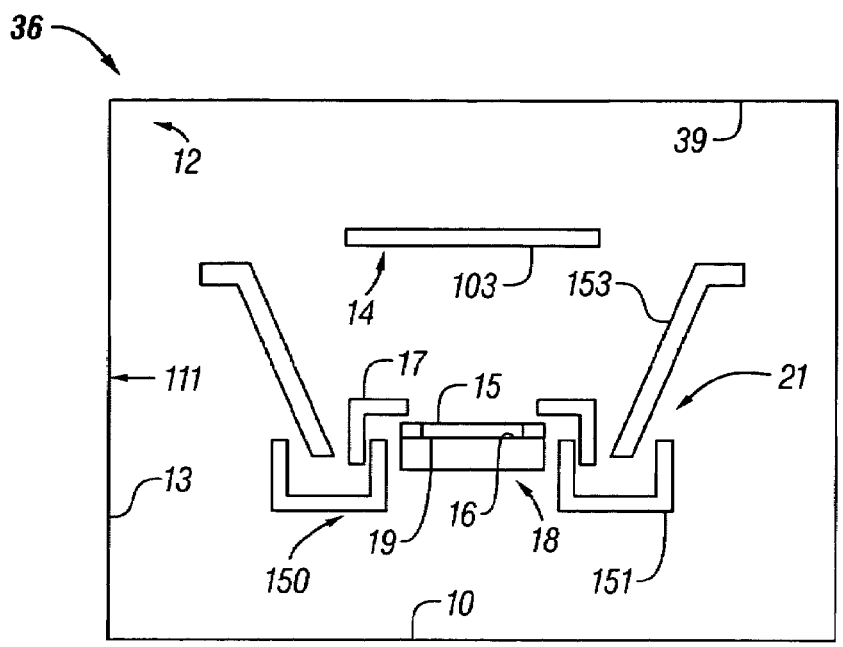
Figure 1C:
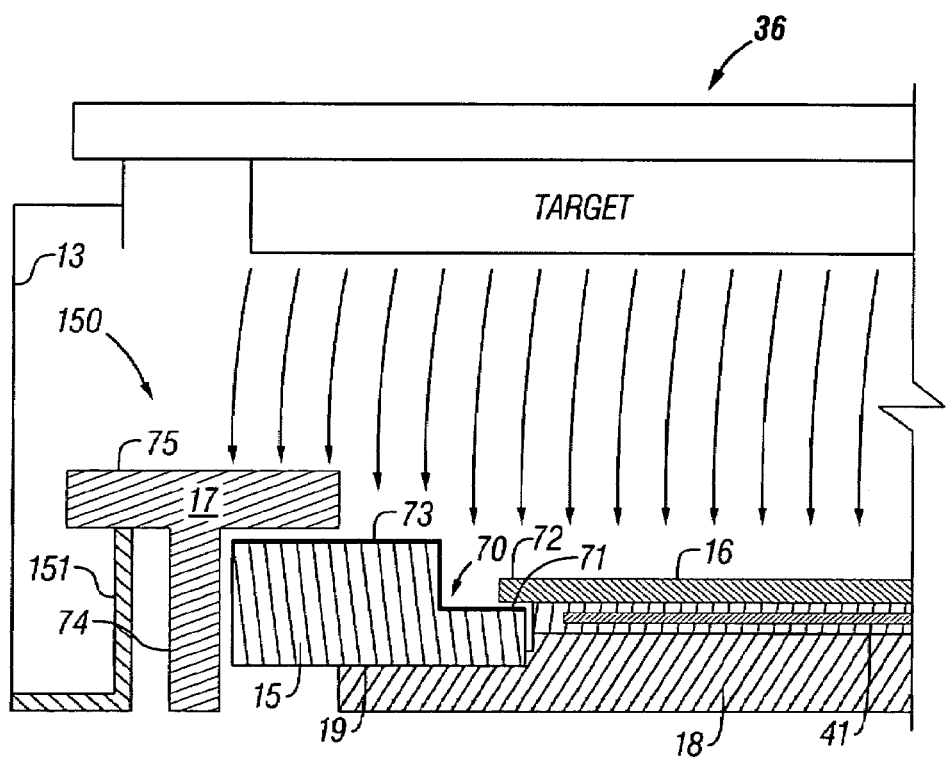

At least some of the components 410 about the substrate that are exposed to the plasma have a textured surface 422 that enhances the adhesion of sputtered deposits that accumulate on the components. These components 410 typically include a deposition shield 21 that at least partially covers an interior chamber surface 111 and shields the interior surface 111 from the accumulation of sputtered material generated in the sputtering process. The surface 111 being shielding may be, for example, an exposed surface of another component, an interior wall, or an edge of the substrate support as shown in FIGS. 1*a*–1*c*. The deposition shield 21 can also serve to direct or redirect the sputtered ions and other species toward the substrate 16 instead of protecting an interior surface.

For example, the deposition shield 21 may be a gas shield 150 positioned adjacent to the sidewalls 13 or ceiling 39. The gas shield 150 may include a lower shielding portion 151 that shields a lower portion of the sidewalls 13 and bottom wall 10 from the process gas, and an upper shielding portion 153 that shields the sidewalls 13 or ceiling 39 from the process gas. The upper shielding portion 153 may also serve as an anode grounding plane. Both shields 151,153 serve to shield and reduce deposition of the sputtered material on the walls of the chamber 36 and also serve to redirect the gas flow in the chamber 36 to a region above the substrate 16.

The deposition shield 21 may also be a deposition ring 15 that encircles the substrate 16 and covers at least a portion of the upper surface 19 of the support 18, as shown in FIG. 1*c*. For example, the deposition ring 15 may be shaped as an annular ring covering an edge of an electrostatic chuck 41 on the support 18 to reduce the exposure of the electrostatic chuck to the plasma and also prevent deposition of sputtered material onto the electrostatic chuck. In one version, the deposition ring 15 at least partially surrounds the substrate 16 and has a lower ledge 70 having a radially inner portion 71 upon which the peripheral edge 72 of the substrate 16 can rest, and a surrounding raised shoulder 73 that is raised higher than the substrate 16.

The deposition shield 21 may also be a cover ring 17 that encircles at least a portion of the deposition ring 15 to reduce deposition of sputtered particles on both the deposition ring 15 and underlying support 18. In the version shown in FIG. 1*c*, the cover ring 17 has a T-shape cross-section with a vertical leg 74 abutting into an horizontally extending leg 75 that extends over the raised shoulder 73 of the deposition ring 15. Other deposition shields 21 having the textured surface 422 may comprise, for example, portions of a chamber enclosure wall 12, such as the sidewall 13, liner (not shown) or ceiling 39 of the chamber 36.

The textured surface 422 on the deposition shields 150 is at least partially exposed to the energized gas, such as the plasma, and thus receives some of the sputter deposits formed in the plasma. When the exposed surfaces around the substrate are substantially entirely covered by the textured surface 422 it has been discovered that the number of particles generated on the substrate 16 during sputtering is substantially reduced. By substantially entirely covered it is meant that the textured surface 422 extends to approximately the edge of the component. The textured surface 422 has a morphology suitable for the improved adhesion and retention of sputtered material 425 on the surface 422. The improved retention reduces "flaking" of the material 425 from the surface 422 and thus reduces the generation of contaminant particles on the substrate 16. In this manner, the textured surface 422 around the substrate improves the processing yields obtained from the substrate 16 being processed in the chamber 36.

The textured surface 422 has valleys 423 and peaks 424 that provide a surface morphology that provides the improved adhesion and retention of sputtered material 425 thereon. The morphology may be measured by an average surface roughness or skewness. The average roughness is the mean of the absolute values of the displacements from the mean line of the peaks 424 and valleys 423 of the roughness features along a surface 422. The skewness is a measure of the asymmetry of the surface profile about the mean line, and is calculated according to the following formula:

$$R_{sk} = \frac{1}{R_q^3} \frac{1}{N} \sum_{j=1}^{N} Z_j^3$$

where $$R_q = \sqrt{\frac{\sum_{i=1}^{N} Z_i^2}{N}}$$

is the root mean square roughness of the surface 422, N is the number of sample points of the surface 422 used to make each skewness measurement, and $Z_1, Z_2, \ldots Z_N$ are the height deviations from the mean line measured at the sample points.

The textured surface 422 may be, for example, a textured coating 420 that covers an underlying surface 426 of the component 410 and is processed to have the desired adhesion characteristics. In the first version, the component 410 comprises an underlying structure 437 formed from a metal or dielectric material into the desired shape and then coated by a coating process that provides the desired textured coating 420. For example, a suitable metal structure 437 can be formed by pouring a molten metal alloy into a mold having the desired shape, including, for example, connector or other structures. The metal is allowed to cool in the mold to form the underlying structure 437. Metallic materials that are suitable for forming the underlying structure 437 may comprise, for example, stainless steel or aluminum. Exemplary components 410 formed by this method include the gas shield 150, deposition ring 15, or cover ring 17.

Figure 2:
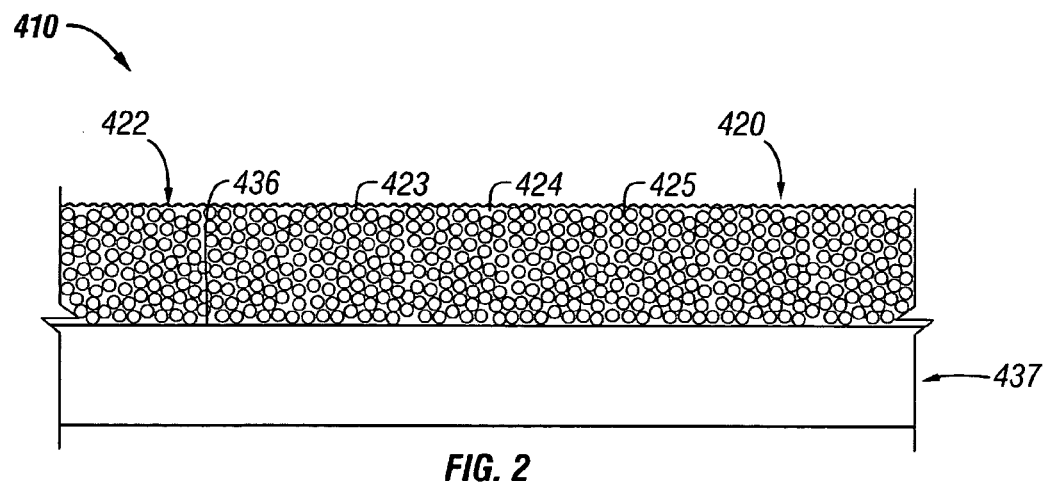
FIG. 2 is a sectional schematic side view of a chamber component having a coating comprising a textured surface.
Figure 3:
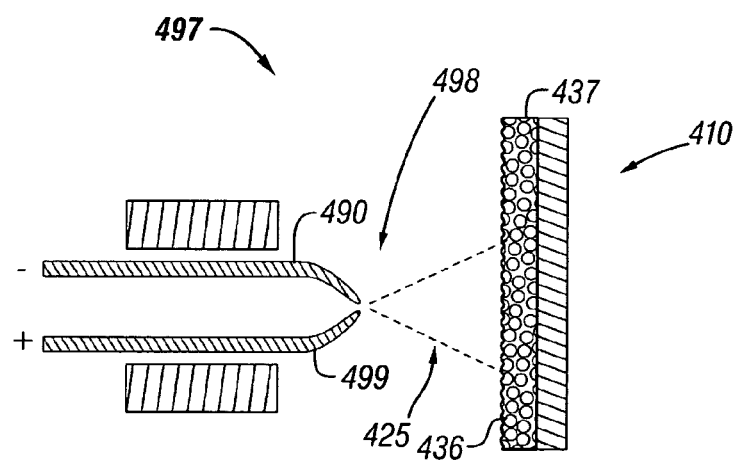
FIG. 3 is a schematic view of a twin wire arc thermal sprayer.

Once the underlying structure 437 is formed, the coating 420 having the textured surface 422 is formed over the surface 426, as shown in FIG. 2. The coating 420 should have a strong bond with the underlying surface 426 and also have the desired surface texture. For example, the coating 420 may be applied by a chemical or physical deposition process, flame spraying, thermal spraying such as a twin wire arc method, plasma arc spraying, or oxy-fuel gas flame spraying. In one version, the coating 420 may comprise a ceramic coating 420, such as a coating 420 comprising aluminum oxide. In another version, the coatings 420 may comprise a metal coating 420, such as a coating comprising aluminum, stainless steel or copper. For example, in one version, the gas shield 150 and cover ring 17 comprise a stainless steel underlying structure 437 covered by an aluminum coating 420. In another version, the deposition ring comprises a stainless steel or aluminum oxide underlying structure 437 covered by an aluminum coating 420. The coating 420 may be applied to a thickness suitable to reduce erosion of surfaces in the chamber 36, such as a thickness of, for example, at least about 0.010 inches, and even at least about 0.015 inches.

In one version, the coating 420 is applied to the underlying surface 426 by a twin wire arc thermal spraying process. In this process, a thermal sprayer 497, as for example, shown in FIG. 4, comprises two consumable electrodes 490, 499 that are shaped and angled to allow an electric arc to form therebetween. For example, the consumable electrodes 490, 499 may comprise twin wires formed from a metal to be coated on the surface 426, which are angled towards each other to allow an electric discharge to form near the closest point 498. An electric arc discharge is generated between the consumable electrodes when a voltage is applied to the consumable electrodes 490, 499 as a carrier gas, such as one or more of air, nitrogen or argon, is flowed between the electrodes 490, 499. Arcing between the electrodes 490, 499 atomizes and at least partially liquifies the metal on the electrodes 490, 499, and carrier gas energized by the arcing electrodes propels the molten particles 425 out of the thermal sprayer 497 and towards the surface 426 of the underlying structure 437. The molten particles impinge on the surface 426 of the ceramic form 437, where they cool and condense to form a conformal coating 3420. When twin wires are used, the wires may be continuously fed into the thermal sprayer to provide a continuous supply of the metal material. Suitable twin wire arc thermal spraying processes, are for example described in U.S. Pat. No. 6,227,435 B1, issued on May 8th, 2001 to Lazarz et al, and U.S. Pat. No. 5,695,825 issued on Dec. 9th, 1997 to Scruggs, both of which are incorporated herein by reference in their entireties. Good textured coatings 420 were found to have a surface roughness average Ra value typically of from about 700 to about 1400 microinches. The roughness average may be measured with standard metrology tools for 3D imaging of microstructures, such as a WYKO SP3000 Surface Profiler available from Veeco Instruments Inc., Woodbury, N.Y.

In another version, the textured surface 422 is an original un-coated surface of a component 410, such as a deposition shield 21, that is fabricated to have the desired surface texture, for example, a component 410 fabricated from pressed ceramic grains into the desired shape. The deposition shield 21 is adapted to at least partially cover the interior surface in the chamber, and comprises a textured surface 422 of pressed ceramic grains that are shaped and sized to cause the sputtered material to adhere thereto. To fabricate the underlying structure 437 of the component 410, a ceramic form is prepared from a mixture of ceramic grains and a binder, such as an organic binder. A mold having the desired shape is filled with the mixed ceramic grains and binder. Typically, the mold has a shape suitable to form a structure that at least partially covers the interior surface in the chamber. Usually, the mold is made from steel but it can also be made from other materials. The contents of the mold are heated and a pressure is applied by a platen of a platen press to hot press the ceramic grains into the desired shape. For example, the hot pressing method can be used to shape ceramic powder and binder in a mold to form a deposition ring 15. The hot pressed preform may be sintered in the press itself or in a furnace to form a hardened structure. Suitable connector or other structures may be formed in the structure prior to sintering. The deposition ring 15 may also be ground to a desired thickness and holes also be drilled or machined into the ceramic material. Suitable ceramic materials may comprise, for example, aluminum oxide or quartz.

In one example, the hot pressing process was performed by maintaining a mixture of ceramic grains and binder in a steel mold at a temperature and pressure suitable to form a structure of pressed ceramic grains having the desired textured surface that is capable of adhering the sputtered material thereto. A suitable ceramic is 92.5% purity aluminum oxide granules having a bulk density of from about 2 to 3 kg/m$^3$. A suitable binder is an organic binder, such as PVA. If the ceramic grains and binder are heated to temperature that is too low, the surface texture has large granules and is too rough and high levels of porosity occur in the sintered ceramic. An excessively high temperature will result in excessive grain growth and increased glassy phase which tends to smooth out the surface. Prolonged sintering will also reduce the surface porosity and hence make the surface too smooth. Thus, it has been determined that a suitable temperature range is from about 1000° C. to about 2000° C. The pressure maintained also effects the surface roughness, grains size and porosity levels. An excessively high pressure will promote grain growth and reduce porosity levels giving rise to a surface texture that is too smooth; while pressure that is too low will give rise to an excessively granular surface texture. Thus, a suitable pressure range is from about 300 MPa to about 800 MPa. A typical sintering and hot pressing duration is from about 5 to about 15 days.

The ceramic grains were selected to have an average grain size of at least about 500 microns, and more preferably about 1500 microns. The grains constituted 92.5% purity aluminum oxide having a bulk density of from about 2 to 3 kg/m$^3$. After sintering the median pore size distribution of the textured surface, as measured by mercury porosimetry or nitrogen adsorption, was in the range of from about 400 to about 1000 micron. The median pore depth ranged from about 15 to about 300 microns pore depth, and in one version, from about 25 to about 125 micron. The textured surface also had an open pore volume of from about 30% to about 40%. In this version, the textured surface had a measured surface profilometry roughness average, Ra, of from about 2000 to about 5000 microinches. In another version, a sintered hot pressed ceramic structure formed from #100 grit size ceramic grains had an average pore size of about 50 micron and a surface roughness Ra measurement of from about 500 to about 1000 microinches. In yet another version, a sintered hot pressed ceramic structure formed from #24 grit size ceramic grains had an average pore size of about 490 micron.

In a sputtering process cycle, a substrate 16 is transported into the chamber 36 and placed on the substrate support 18. Gas is introduced into the chamber 36 by the gas supply 23 and maintained at a suitable pressure in the chamber 36 by the throttle valve 37. The gas energizer 90 energizes the gas to sputter material from the target 14 and deposit the sputtered material on the substrate 16 while the magnetic field generator 35 maintains a magnetic field 105 in the chamber 36 to increase the ion density of the energized gas. Spent gas and gas by-products are exhausted by the exhaust system 28. Upon completion of the sputtering cycle, the substrate 16 may be removed from the chamber 36 and the sputtering process cycle may be repeated a desired number of times to process a series of substrates 16 in the sputtering chamber 36.

It has been discovered that a combination of the components 410 having the textured surface 422, the target 14 comprising the hot isostatically pressed material 103, and the optimal magnetic field strength values cooperate to provide the unexpectedly good results in the reduction of particle generation on the substrate 16. The target 14 and magnetic field generator 35 cooperate to reduce the number of particles falling from the target 14 onto the substrate 16 by providing a more uniform and stable sputtering surface and by decreasing redeposition of sputtered material onto the target 14. The components 410 having the textured surfaces 422 reduce particle generation by capturing and securing stray sputter material and process by-products. Thus, by providing the components 410, target 14, and optimal magnetic field strength, a series of substrates 16 may be processed in the chamber 36 by repeating a sputtering process cycle without generating an unacceptably high number of particles on the substrates 16, and without necessitating frequent cleaning of the chamber 36 to remove sputtered materials from surfaces of components 410 in the chamber 36.

Furthermore, advantageously, the large sequentially processed batch of at least about 8000 substrates, or even about 10,000 substrates, may be continuously processed in the chamber 36 substantially without stopping to clean the chamber. For example, a process was conducted with repeated sputtering cycles to process a batch of at least about 8000 substrates without cleaning the chamber in between the substrate processing cycles. In this example, an average particle count of 30 particles per 314 cm$^2$ of substrate surface area was measured for the batch of processed substrates. This provides an average particle count of more than about 1 particle per 10 cm$^2$ of substrate surface area for the batch of processed substrates. The reduction in particle generation is a result of the cooperation of the improved components 410, target 14, and process conditions that reduce the flaking of sputtered materials 425 from chamber surfaces onto the substrates 16, and is greater than would be expected from the function of each component 410 alone. In particular, the combination of improved components 410 and conditions provides for an unexpectedly improved reduction in particle generation in the sputter processing of even a large batch of substrates 16 in the chamber 36. By reducing the generation of particles on the substrates 16, the number of substrates processed between cleaning cycles may be increased, thereby significantly increasing the processing throughout and improved yield efficiency of the chamber 36.

As the substrates 16 are processed, sputtered material 425 builds up on surfaces in the chamber 36, such as on surfaces of deposition shields 21 or other components 410 in the chamber 36. Excessive build up of this sputtered material 425 may be undesirable, as the sputtered material 425 may flake from the surfaces in the chamber 36 and deposit on the substrate 16. Thus, a cleaning cycle may be performed at selected intervals between a large number of sputtering cycles, such as at least about 8,000 or even 10,000 process cycles, to remove the sputtered materials 425 from the chamber surfaces. In the cleaning cycle, a cleaning gas, such as a fluorinated gas, for example, $CF_4$, is introduced into the chamber 36 by the gas supply 23 and maintained at a suitable pressure in the chamber 36 by the throttle valve 37. The gas energizer 90 energizes the cleaning gas to clean surfaces in the chamber 36. Spent cleaning gas and cleaning residues are exhausted by the exhaust system 28.

EXAMPLES

The following examples demonstrate the unexpected and superior results given in the processing of substrates 16 in according to the method of the present invention over conventional substrate processing methods. In the examples, substrates 16 were processed in sputtering process cycles according to the present improved method and a conventional method, and the number of particles generated on each substrate 16 after its processing was counted to compare the methods. The substrates 16 were processed in an improved chamber 36 having textured surfaces 422 on the upper and lower shields 151,153, the deposition ring 15 and the cover ring 17. The chamber 36 also comprised a sputtering target 14 comprising sputtering material 103 formed in a hot isostatic pressing process. Furthermore, a magnetic field strength of at least about 300 Gauss was maintained in the chamber 36 during processing of the substrates 16. For comparison, other substrates 16 were processed in a conventional chamber comprising smooth, un-textured surfaces and a sputtering target 14 comprising sputtering material 103 formed by a conventional CVD process, and in which a low magnetic field strength was maintained.

Figure 6A:
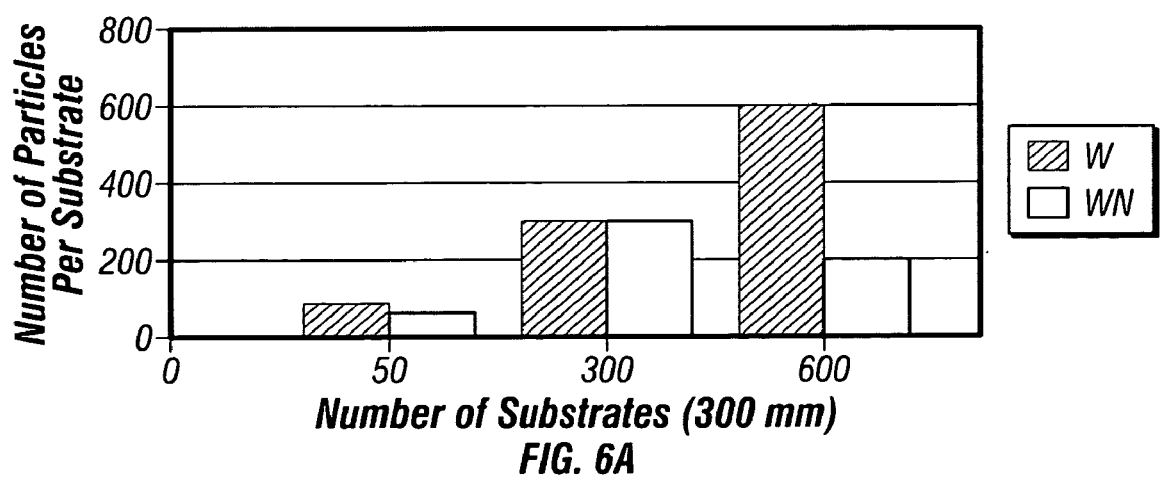
FIG. 6a is bar graph showing the number of particles greater than 0.3 micron counted per substrate when processing the substrate in a conventional process.

FIG. 6a is a bar graph showing the number of particles greater than 0.3 microns that were counted on 300 mm diameter substrates 16 after performing conventional sputtering process cycles using the conventional apparatus and method. In these example, tungsten and tungsten nitride layers were deposited on 50, 300 and 600 of the substrates 16. In the deposition of tungsten layers, FIG. 6a shows that the average number of particles generated on each substrate 16 increased with increasing number of substrates 16 processed, from less than about 100 particles after processing 50 substrates 16 to about 600 particles after processing 600 substrates 16. In the deposition of tungsten nitride layers, the average number of particles on each substrate also increases from less than about 100 particles after processing 50 substrates to greater than about 200 particles after processing 300 substrates. While the number of particles generated during deposition of the tungsten nitride layer decreased after processing 600 substrates, the number of particles counted remained unacceptably high, at 200 particles per substrate 16. Thus, processing of the substrates 16 according to a conventional sputtering process resulted in unacceptably high numbers of particles on the substrates 16, as a result of the flaking of accumulated residues and sputtered materials from the un-textured surfaces and target 14.

Figure 6B:
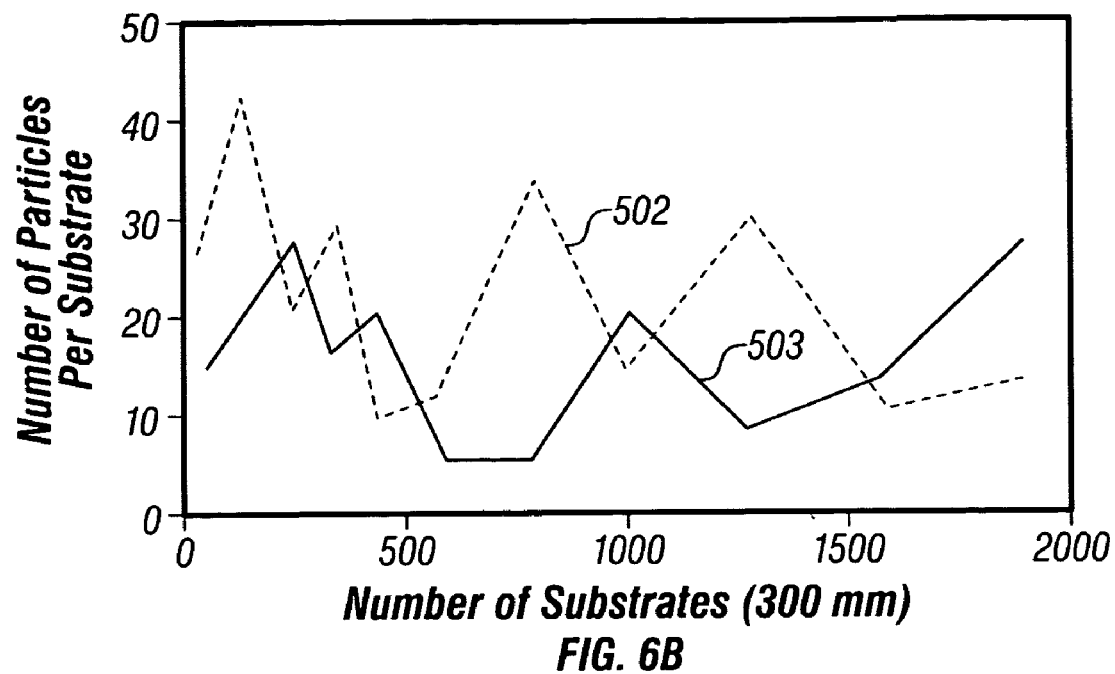
FIG. 6b is a line graph showing the number of particles greater than 0.3 micron counted per substrate when processing the substrates according to an embodiment of the present process.

In comparison, FIG. 6b is a line graph showing the number of particles greater than 0.3 microns that were counted on 300 mm diameter substrates 16, after performing the sputtering cycles with the improved method to deposit tungsten layers, as shown by line 502, and tungsten nitride layers, as shown by line 503, on the substrates 16. Comparison of FIG. 6b with FIG. 6a shows that the present improved method provided unexpectedly low numbers of particles per substrate 16 after multiple process cycles in comparison to the conventional method. For example, the number of particles generated after processing 300 substrates with the conventional method was more than about 200, as shown in FIG. 6a, whereas the number of particles generated after processing 300 substrates was less than about 30 for the deposition of tungsten, and less than about 40 for the deposition of tungsten nitride, as shown in FIG. 6b. Furthermore, in the conventional process, the number of particles generated after processing 600 substrates was about 600 for the tungsten layer and about 200 for the deposition of tungsten, whereas in the improved process, less than about 30 particles were generated during tungsten deposition and less than about 30 particles were generated during tungsten nitride deposition after processing about 600 substrates. Thus, the present process provided unexpectedly low levels of particle generation in the deposition of layers on the substrate 16.

Figure 6C:
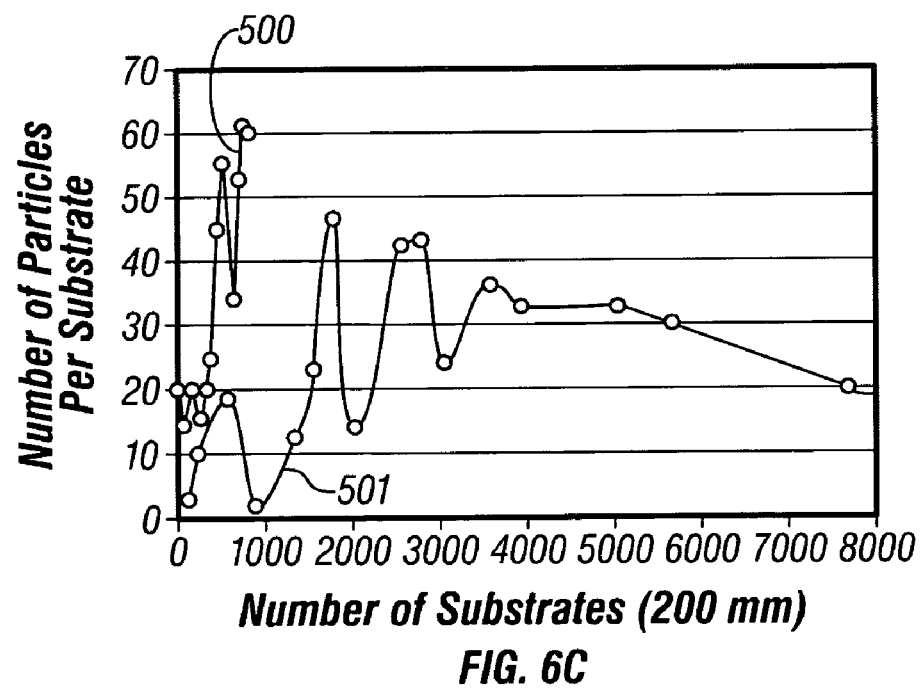
FIG. 6c is a line graph comparing the number of particles greater than 0.2 micron counted per substrate in the processing of substrates by conventional processes and processes according to embodiments of the present invention.

FIG. 6c is a line graph showing the number of particles greater than 0.2 micron that were counted on 200 mm diameter (~314 cm$^2$ surface area) substrates 16 after a number of processing cycles to sputter deposit tungsten in both the conventional method, as shown by line 500, and in the improved method, as shown by line 501. The graph shows that unexpectedly good results were obtained with the improved method of sputtering the substrates 16 according to the present invention, as the number of particles counted per substrate 16 in the conventional method was substantially higher than the number counted in the improved method. For example, after processing 1000 substrates, the conventional process generated about 65 particles per substrate, whereas the improved process generated about 10 particles per substrate. Furthermore, in the conventional process, the number of particles counted per substrate increased periodically with the number of substrates processed, with a particle count of about 20 for the first couple of substrates processed up to a particle count of about 65 after processing of about 1000 substrates. Thus, the conventional process resulted in an average of 50 particles generated on the substrates for 1000 process cycles. Note that a much smaller number of particles of FIG. 6c, as compared to the results of FIGS. 6b and 6c occurs because of the smaller diameter, and thus smaller surface areas, of these substrates 16. In contrast, with the present improved method, the number of particles counted per substrate 16 averaged only about 10 for 1000 process cycles, with the highest number of particles counted being about 20. This represents a surprising decrease in the average number of particles generated per substrate 16 of greater than about 80% in comparison with the conventional process. Furthermore, as the process cycles were repeated for up to 8000 cycles in the improved process, the number of particles counted oscillated between less than about 5 to about 45 particles, and the peak amplitude of the oscillation decreased after processing about 1500 substrates until about 4000 substrates had been processed, at which point the number of particles generated steadily declined. Thus, the improved method allowed for at least about 1000 substrates, and even at least about 8000 substrates to be processed in the sputtering process cycles without generating on average more than about 1 particle per 10 cm$^2$ of substrate surface area on each substrate.

Thus, the instant method of processing substrates in a chamber 36 having internal textured surfaces 420, a target 14 comprising sputtering material 103 formed in a hot isostatic pressing process, and an increased magnetic field strength provides unexpectedly good results in the sputter deposition of material on a substrate 16. This combination of elements provides a surprising and significant decrease in the number of particles generated on individual substrates 16 being processed in the chamber. The process may even allow processing of at least about 8000 substrates in the chamber 36 without generating more than an average of about 30 particles per substrate 16 for substrates having a surface area of about 314 cm$^2$. Thus, the method may allow for sputtering of the substrates 16 in sputtering process cycles for at least about 1000 cycles without performing a cleaning process.

Figure 7:
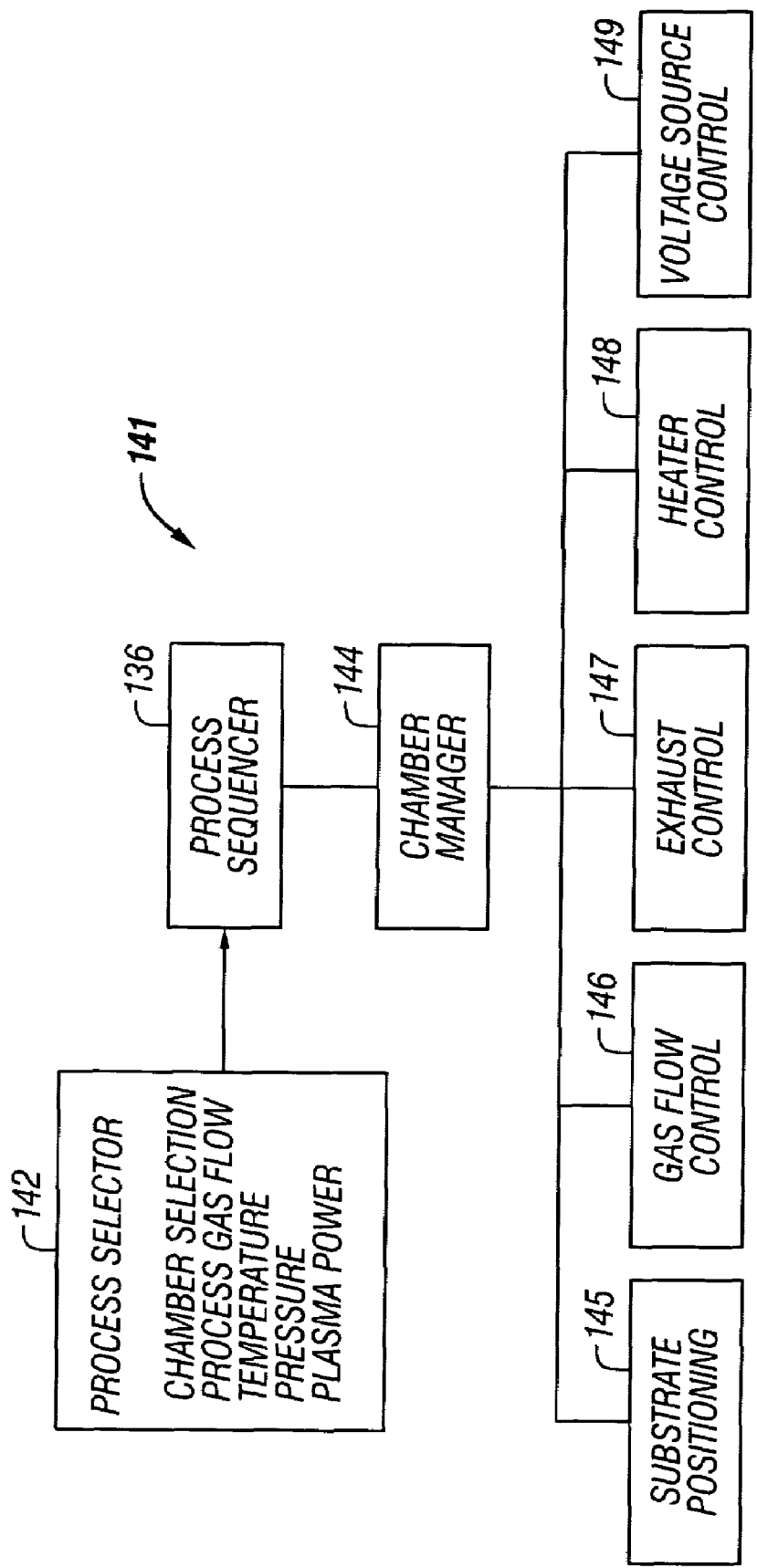

The process may be implemented using a computer program product 141 that includes the process sequencer 136 and that runs on a controller 30, as shown in FIG. 7, comprising a central processing unit (CPU) interconnected to a memory system with peripheral control components, such as for example a 68400 microprocessor, commercially available from Synergy Microsystems, California. The computer program code can be written in any conventional computer readable programming language, such as for example, assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters a process set and chamber number into a process selector program code 142. The process sets are predetermined sets of process parameters necessary to carry out specified processes in a specific chamber, and are identified by predefined set numbers. The process parameters relate to process conditions such as, for example, process gas composition and flow rates, temperature, pressure, gas energizing process conditions such as non-pulsed or pulsed DC power levels and magnetic field power levels, cooling gas pressure, and chamber wall temperature.

The process sequencer 136 comprises program code for accepting the identified chamber 36 and set of process parameters from the process selector program code 142, and for controlling operation of the various chambers 36 in a multi-chamber system. Multiple users can enter process set numbers and chamber numbers, or a user can enter multiple process set numbers and chamber numbers, so the process sequencer 136 operates to schedule the selected processes in the desired sequence. Preferably, the process sequencer 136 includes a program code to perform the steps of (i) monitoring the operation of the chambers 36 to determine if the chambers 36 are being used, (ii) determining what processes are being carried out in the chambers 36 being used, and (iii) executing the desired process based on availability of a particular chamber 36 and type of process to be carried out. Conventional methods of monitoring the chambers 36 can be used, such as polling. When scheduling which process is to be executed, the process sequencer 136 can be designed to take into consideration the present condition of the chamber 36 being used in comparison with the desired process conditions for a selected process, or the "age" of each particular user entered request, or any other relevant factor a system programmer desires to include for determining scheduling priorities.

Once the process sequencer 136 determines which chamber and process set combination is going to be executed next, the sequencer program code 143 causes execution of the process set by passing the particular process set parameters to a chamber manager program code 144 which controls multiple processing tasks in different chambers 36a–d according to the process set determined by the process sequencer 136. For example, the chamber manager program code 144 comprises program code for controlling PVD process operations, within the described chamber 36. The chamber manager program code 144 also controls execution of various chamber component program codes or program code modules, which control operation of the chamber components 300 necessary to carry out the selected process set. Examples of chamber component program codes are a substrate positioning program code 145, gas flow control program code 146, exhaust control program code 147, heater control program code 148, and voltage source control program code 149. Those having ordinary skill in the art would readily recognize that other chamber control program codes can be included depending on what processes are desired to be performed in the chamber 36.

In operation, the chamber manager program code 144 selectively schedules or calls the process component program codes in accordance with the particular process set being executed. The chamber manager program code 144 schedules the process component program codes similarly to how the sequencer program code 143 schedules which chamber 36a–d and process set is to be executed next. Typically, the chamber manager program code 144 includes steps of monitoring the various chamber components 300, determining which components 300 need to be operated based on the process parameters for the process set to be executed, and causing execution of a chamber component program code responsive to the monitoring and determining steps. In one version, the chamber manager program code 144 comprises program code to call the process program codes to process a substrate 16 in a sputtering process cycle in the chamber 36, and repeat the sputtering process cycle to process at least about 1000 substrates, and even about 8000 substrates. After at least about 1000 sputtering process cycles, for example after about 8000 sputtering process cycles, the chamber manager program code 144 may call process program codes to perform a cleaning process cycle to clean surfaces in the chamber 36.

Operation of particular chamber component program codes will now be described. The substrate positioning program code 145 comprises program code for controlling chamber components 300 that are used to transfer a substrate 16 onto the substrate support 18, and optionally, to lift the substrate 16 to a desired height in the chamber 36 to control the spacing between the substrate 16 and a target. When a substrate 16 is transferred into the chamber 36, the substrate support 18 is lowered to receive the substrate 16, and thereafter, the support 18 is raised to the desired height in the chamber 36. The substrate positioning program code 145 controls movement of the support 18 in response to process set parameters related to the support height that are transferred from the chamber manager program code 144.

The gas flow program code 146 is for controlling process gas composition and flow rates. Generally, the gas conduits 34 for each of the process gases, include safety shut-off valves (not shown) that can be used to automatically or manually shut off the flow of process gas into the chamber 36. When toxic gases are used in the process, the several safety shut-off valves are positioned on each gas conduit 34 in conventional configurations. The gas flow program code 146 controls an open/close position of the safety shut-off valves, and also ramps up/down the mass flow controllers to obtain the desired gas flow rate. The gas flow program code 146 is invoked by the chamber manager program code 144, as are all chamber component program codes, and receives from the chamber manager program code, the process parameters that are related to desired gas flow rates. Typically, the gas flow program code 146 operates by repeatedly reading the necessary mass flow controllers, comparing the readings to the desired flow rates received from the chamber manager program code 144, and adjusting the flow rates as necessary. Furthermore, the gas flow program code 146 includes steps for monitoring the gas flow rates for unsafe rates, and activating the safety shut-off valves when an unsafe condition is detected.

When the exhaust control program code 147 is invoked, a desired pressure level is received as a parameter from the chamber manager program code 144. The exhaust control program code 147 operates to measure the pressure in the chamber 36 by reading one or more conventional pressure nanometers (not shown) connected to the chamber 36, compare the measure value(s) to the target pressure, obtain PID (proportional, integral, and differential) values from a stored pressure table corresponding to the target pressure, and adjust a throttle valve 37 of the exhaust 28 according to the PID values obtained from the pressure table. Alternatively, the pressure in the chamber 36 may be adjusted by regulating the opening size of the throttle valve 37 in the exhaust conduit 34 of the exhaust system 28.

The optional heater control program code 148 comprises program code for controlling the temperature of an optional heater (not shown) that may be used to heat the substrate 16. The heater control program code 148 measures temperature by measuring voltage output of a thermocouple (not shown) located in the support 18, compares the measured temperature to the set-point temperature, and increases or decreases current applied to the heater to obtain the desired ramp rate or set-point temperature. The temperature is obtained from the measured voltage by looking up the corresponding temperature in a stored conversion table, or by calculating the temperature using a fourth order polynomial. When radiant lamps are used as the heater, the heater control program code 148 gradually controls a ramp up/down of current applied to the lamp that increases the life and reliability of the lamp. Additionally, a built-in fail-safe mode can be included to detect process safety compliance, and to shut down operation of the heater if the chamber 36 is not properly set up.

The voltage source program code 149 comprises program code for controlling a voltage source, such as the DC voltage source, to energize the gas in the chamber 36 to sputter material from the target 14. For example, the program code 149 may set pulsed DC voltage levels applied to the target 14 and may also set the electrical state of the gas shield 150 in the chamber 36. Similarly to the previously described chamber component program codes, the program code 149 is invoked by the chamber manager program code 144. In operation, the program code 149 includes steps for reading both "forward" power applied to the target 14, and "reflected" power flowing through the chamber 36. An excessively high reflected power reading indicates that the plasma has not been ignited, and the program code 149 restarts or shuts down the process. The read power levels are compared against target levels, and the current is adjusted to control the plasma.

Although exemplary embodiments of the present invention are shown and described, those of ordinary skill in the art may devise other embodiments which incorporate the present invention, and which are also within the scope of the present invention. For example, other components 410 other than those specifically mentioned may comprise the textured surface 422. Also, the target 14 may comprise sputtering materials 103 other those specifically mentioned, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of processing a substrate in a magnetron sputtering chamber, the method comprising:
    (a) placing a substrate in the chamber;
    (b) providing a deposition shield having a textured surface about the substrate, the textured surface comprising pressed ceramic grains that are shaped and sized to cause the sputtered material to adhere thereto, the ceramic grains having an average grain size of at least about 500 microns;
    (c) providing an isostatically pressed and sintered tungsten sputtering target facing the substrate, the tungsten target being substantially absent voids and comprising a density of at least about 99.99% of the theoretical maximum; and
    (d) applying an electrical power to the tungsten target to form a plasma in the chamber while applying a magnetic field adjacent to the tungsten target, whereby the tungsten target is sputtered to deposit sputtered material on the substrate.

2. A method according to claim 1 wherein the textured surface comprises a surface roughness average Ra of from about 700 to about 1400 microinches.

3. A method according to claim 1 wherein the textured surface comprises an arc sprayed coating.

4. A method according to claim 3 wherein the arc sprayed coating comprises aluminum oxide.

5. A method according to claim 1 wherein the textured surface is a surface of a hot pressed ceramic structure.

6. A method according to claim 1 comprising applying a magnetic field having a strength of at least about 300 Gauss.

7. A method according to claim 6 comprising rotating the magnetic field applied about the tungsten sputtering target at a speed of from about 80 to about 100 rpm.

8. A method according to claim 1 comprising repeating steps (a) and (d) to process a batch of at least about 8,000 substrates without performing a cleaning process to clean internal surfaces in the chamber, and wherein the average particle count of the batch of processed substrates is less than about 1 particle/10 $cm^2$ of substrate surface area.

9. A method of processing a batch of substrates in a magnetron sputtering chamber, the method comprising:
    (a) in a sputtering process cycle,
        (i) placing a substrate in the chamber;
        (ii) providing a deposition shield having a textured surface about the substrate, the textured surface comprising pressed ceramic grains that are shaped and sized to cause the sputtered material to adhere thereto, the ceramic grains having an average grain size of at least about 500 microns, and the textured surface having a surface roughness average Ra of from about 700 to about 1400 microinches;
        (iii) providing a tungsten sputtering target facing the substrate, the tungsten target (1) being formed by isostatic pressing and sintering, (2) having a density substantially greater than 99.99% of the theoretical maximum density of the target material, and (3) being substantially absent voids; and
        (iv) applying an electrical power to the tungsten target to form a plasma to sputter the tungsten target while applying a rotating magnetic field of at least about 300 Gauss adjacent to the tungsten target at a speed of from about 80 to about 100 rpm; and (b) repeating the sputtering process cycle to process a batch of at least about 8,000 substrates without performing a cleaning process to clean internal surfaces in the chamber between the substrate processing steps and wherein the average particle count of the batch of processed substrates is less than about 1 particle per 10 cm$^2$ of substrate surface area.

10. A magnetron sputtering chamber comprising:
(a) a substrate support;
(b) a deposition shield having a textured surface about the substrate, the textured surface comprising pressed ceramic grains that are shaped and sized to cause the sputtered material to adhere thereto, the ceramic grains having an average grain size of at least about 500 microns;
(c) a gas supply system to provide a gas in the chamber;
(d) an isostatically pressed and sintered tungsten target facing the substrate support, the tungsten target being substantially absent voids and comprising a density of at least about 99.99% of the theoretical maximum;
(e) a power source to apply an electrical power to the tungsten target to form a plasma in the chamber; and
(f) a magnetic field generator capable of applying a magnetic field of at least about 300 Gauss adjacent to the tungsten target, whereby the tungsten target may be sputtered by the plasma to deposit sputtered material on a substrate on the substrate support.

11. A chamber according to claim 10 further comprising a controller adapted to control a substrate transport capable of transporting substrates into the chamber, the power source, the gas supply system, and the magnetic field generator, to process a batch of at least about 8,000 substrates without performing a cleaning process to clean internal surfaces in the chamber between the substrate processing steps, and wherein the average particle Count of the batch of processed substrates is less than about 1 particle per 10 cm$^2$ of substrate surface area.

12. A chamber according to claim 10 wherein the textured surface comprises an arc sprayed coating having a surface roughness average Ra of from about 700 to about 1400 microinches.

13. A chamber according to claim 10 wherein the textured surface comprises a surface of a hot pressed ceramic structure having a surface roughness average Ra of from about 2000 to about 5000 microinches.

14. A magnetron sputtering chamber comprising:
(a) a substrate support;
(b) a deposition shield having a textured surface about the substrate, the textured surface comprising pressed ceramic grains that are shaped and sized to cause the sputtered material to adhere thereto, the ceramic grains having an average grain size of at least about 500 microns, and the textured surface having a surface roughness average Ra of from about 700 to about 1400 microinches;
(c) a gas supply system to provide a gas in the chamber;
(d) a tungsten sputtering target facing the substrate support, the tungsten target (i) comprising an isostatically pressed and sintered material, (ii) having a density substantially greater than 99.99% of the maximum theoretical density of the target material, and (iii) being substantially absent voids;
(e) a power source to apply an electrical power to the tungsten target to form a plasma in the chamber;
(f) a magnetic field generator capable of applying a rotating magnetic field of at least about 300 Gauss adjacent to the tungsten target, the magnetic field being rotated at a speed of from about 80 to about 100 rpm; and
(g) a controller adapted to control a substrate transport capable of transporting substrates into the chamber, the power source, the gas supply system, and the magnetic field generator,
to deposit sputtered material, sequentially, on a batch of at least about 8,000 substrates without performing a chamber cleaning process between the substrate processing steps and such that the average particle count measured for the batch of processed substrates is less than about 1 particle per 10 cm$^2$ of substrate surface area.

15. A deposition shield capable of shielding an interior surface in a magnetron sputter deposition chamber from sputtered material generated in the chamber, the deposition shield comprising:
a structure adapted to at least partially cover the interior surface in the chamber, the structure comprising a textured surface of pressed ceramic grains that are shaped and sized to cause the sputtered material to adhere thereto, the ceramic grains having an average grain size of at least about 500 microns.

16. A deposition shield according to claim 15 wherein the textured surface comprises a median pore size of from about 400 to about 1000 micron.

17. A deposition shield according to claim 16 wherein the textured surface comprises a median pore depth of from about 15 to about 300 microns.

18. A deposition shield according to claim 17 wherein the textured surface comprises an open pore volume of from about 30% to about 40%.

19. A deposition shield according to claim 15 wherein the textured surface comprises a Ra of from about 2000 to about 5000 microinches.

20. A deposition shield according to claim 15 wherein the structure is a deposition ring.

21. A magnetron sputtering chamber comprising:
(a) a substrate support;
(b) a deposition shield having a textured surface about the substrate support, the textured surface comprising pressed ceramic grains that are shaped and sized to cause the sputtered material to adhere thereto, the ceramic grains having an average grain size of at least about 500 microns;
(c) a gas supply system to provide a gas in the chamber;
(d) a target facing the substrate support; and
(e) a magnetic field generator capable of applying a rotating magnetic field adjacent to the target.

22. A chamber according to claim 21 wherein the deposition shield comprises a textured surface comprising at least one of:
(1) a median pore size of from about 400 to about 1000 micron;
(2) a median pore depth of from about 15 to about 300 microns; and
(3) an open pore volume of from about 30% to about 40%.

23. A chamber according to claim 21 wherein the target comprises an isostatically pressed and sintered target.

24. A chamber according to claim 21 wherein the target comprises tungsten.

25. A chamber according to claim 21 wherein the magnetic field generator is capable of applying a rotating magnetic field of at least about 300 Gauss adjacent to the target.

26. A magnetron sputtering chamber comprising:
(a) a substrate support;
(b) a deposition shield having a textured surface about the substrate support, the textured surface comprising pressed ceramic grains that are shaped and sized to cause the sputtered material to adhere thereto, the ceramic grains having an average grain size of at least about 500 microns;
(c) a gas supply system to provide a gas in the chamber;
(d) an isostatically pressed and sintered tungsten sputtering target facing the substrate, the tungsten target being substantially absent voids and comprising a density of at least about 99.99% of the theoretical maximum; and
(e) a magnetic field generator capable of applying a rotating magnetic field adjacent to the target.

27. A chamber according to claim 26 wherein the deposition shield comprises a textured surface comprising at least one of:
(1) a median pore size of from about 400 to about 1000 micron;
(2) a median pore depth of from about 15 to about 300 microns; and
(3) an open pore volume of from about 30% to about 40%.

28. A method of processing a substrate in a magnetron sputtering chamber, the method comprising:
(a) placing a substrate in the chamber;
(b) providing a deposition shield having a textured surface about the substrate, the textured surface comprising pressed ceramic grains that are shaped and sized to cause the sputtered material to adhere thereto, the ceramic grains having an average grain size of at least about 500 microns;
(c) providing a sputtering target facing the substrate; and
(d) applying an electrical power to the tungsten target to form a plasma in the chamber while applying a magnetic field adjacent to the target, whereby the target is sputtered to deposit sputtered material on the substrate.

* * * * *